US009184744B2

United States Patent
Kreuter et al.

(10) Patent No.: US 9,184,744 B2
(45) Date of Patent: Nov. 10, 2015

(54) GATE SIGNAL GENERATION WITH ADAPTIVE SIGNAL PROFILES

(71) Applicant: Infineon Technologies AG, Neubiberg (DE)

(72) Inventors: Hans-Peter Kreuter, Villach (AT); Mathias Blank, Vienna (AT); Tobias Glueck, Vienna (AT); Andreas Kugi, Vienna (AT)

(73) Assignee: Infineon Technologies AG, Neubiberg (DE)

( * ) Notice: Subject to any disclaimer, the term of this patent is extended or adjusted under 35 U.S.C. 154(b) by 61 days.

(21) Appl. No.: 14/213,080

(22) Filed: Mar. 14, 2014

(65) Prior Publication Data

US 2015/0263724 A1 Sep. 17, 2015

(51) Int. Cl.
*H03K 17/567* (2006.01)
*H03K 17/687* (2006.01)

(52) U.S. Cl.
CPC ............ *H03K 17/567* (2013.01); *H03K 17/687* (2013.01)

(58) Field of Classification Search
CPC .......................... H03K 17/567; H03K 17/687
USPC ......................................................... 327/108
See application file for complete search history.

(56) References Cited

U.S. PATENT DOCUMENTS

| 5,952,817 | A  | * | 9/1999 | Brewster et al. ............... 323/268 |
| 6,138,042 | A  | * | 10/2000 | Midya et al. ................... 455/571 |
| 8,674,675 | B2 | * | 3/2014 | Chevrier ......................... 323/298 |
| 8,710,876 | B2 | * | 4/2014 | Lobsiger et al. ............... 327/109 |

OTHER PUBLICATIONS

Oswald, N. et al., "Analysis of Shaped Pulse Transitions in Power Electronic Switching Waveforms for Reduced EMI Generation," IEEE Transactions on Industry Applications, vol. 47, No. 5, Sep./Oct. 2011, pp. 2154-2165.
Reby, F. et al., "Reduction of Radiated and Conducted Emissions in Power Electronic Circuits by the Continuous Derivative Control Method (C.D.C.M.)," IEEE Power Electronics and Variable Speed Drives Conference Publication No. 456, Sep. 21-23, 1998, pp. 158-162.
Kuhn, H. et al., "Considerations for a Digital Gate Unit in High Power Applications," IEEE Power Electronics Specialists Conference, Jun. 15-19, 2008, pp. 2784-2790.

* cited by examiner

*Primary Examiner* — Kenneth B Wells
(74) *Attorney, Agent, or Firm* — Shumaker & Sieffert, P.A.

(57) ABSTRACT

A gate signal is generated by summation of multiple signal profiles. The gate signal is applied to a switching device to switch the switching device between an off state and an on state. While the gate signal is applied to the switching device, at least an n-th order derivative of a load signal of the switching device is detected, with n being an integer which is equal to or larger than 2. Depending on the detected n-th order derivative, one or more of the signal profiles are adapted.

23 Claims, 9 Drawing Sheets

US 9,184,744 B2

GATE SIGNAL GENERATION WITH ADAPTIVE SIGNAL PROFILES

TECHNICAL FIELD

The present application relates to a generation of a gate signal of a switching device and to corresponding devices and methods.

BACKGROUND

For electronically switching a signal applied to a load between an on state and an off state, various kinds of switching devices may be used. For example, in the field of high-power electronics, transistor-based power devices may be employed for such switching tasks. Such power devices may for example be implemented on the basis of a Metal Oxide Field Effect Transistor (MOSFET) or on the basis of a Insulated Gate Bipolar Transistor (IGBT).

However, in particular when performing the switching at high frequencies, e.g., in the range of 100 kHz, electromagnetic interference (EMI) may be generated and affect the power device itself or other devices. Accordingly, it may be necessary to limit EMI to meet technical standards, such as CISPR 25, and/or to achieve a desired level of electromagnetic compatibility (EMC).

Accordingly there is a need for techniques which allow for efficient and reliable operation of a switching device.

SUMMARY

According to an embodiment, a device is provided. The device includes a gate signal generator. The gate signal generator is configured to generate a gate signal which is applied to switch a switching device between an off state and an on state. The gate signal generator is configured to generate the gate signal by summation of multiple signal profiles. Further, the device includes a detector. The detector is configured to detect, while the gate signal is applied to the switching device, at least an n-th order derivative of a load signal of the switching device, with n being an integer which is equal to or larger than 2. Further, the device includes an adaptation circuit. The adaptation circuit is configured to adapt one or more of the signal profiles depending on the detected n-th order derivative. The device may be part of a switching device or may be implement a separate gate driver for the switching device.

According to a further embodiment, a method is provided. According to the method, a gate signal is generated by summation of multiple signal profiles. The gate signal is applied to a switching device to switch the switching device between an off state and an on state. While the gate signal is applied to the switching device, at least an n-th order derivative of a load signal of the switching device is detected, with n being an integer which is equal to or larger than 2. Depending on the detected n-th order derivative, one or more of the signal profiles are adapted.

According to further embodiments, other devices, systems, or methods may be provided. Such embodiments will be apparent from the following detailed description in connection with the accompanying drawings.

DETAILED DESCRIPTION

Figure 1:
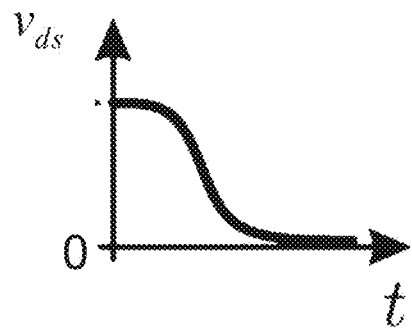
FIG. 1 shows an exemplary signal course of a load signal of a switching device and corresponding signal courses of the first and second order derivative.
Figure 1:
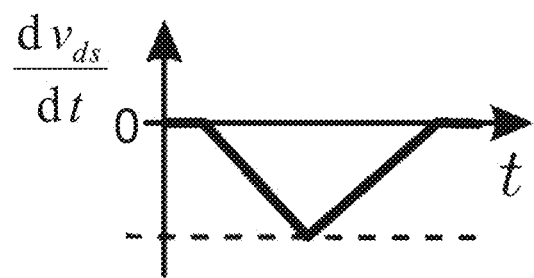
Figure 1:
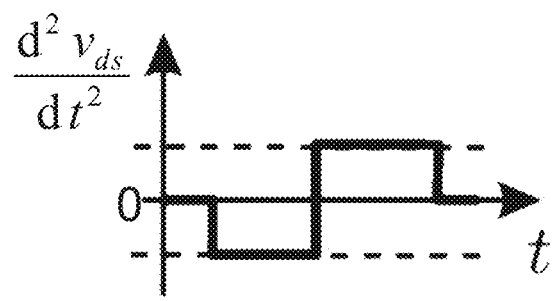

In the following, various embodiments will be described in detail with reference to the accompanying drawings. It should be noted that these embodiments serve only as examples and are not to be construed as limiting. For example, while embodiments with a plurality of features, other embodiments may comprise less features and/or alternative features.

Furthermore, features from different embodiments may be combined with each other unless specifically noted otherwise.

Embodiments as illustrated in the following relate to generation of a gate signal applied to switch a switching device between an on state and an off state. The gate signal may for example be a current which is applied to charge or discharge a gate electrode of the switching device. However, in alternative implementations the gate signal could also be a voltage applied to the gate electrode. The on state is assumed to be a state in which the switching device passes a load current. The off state is assumed to be a state in which the switching device substantially blocks the load current. The load current is one possible representation of a load signal of the switching device. Other representations include a drain-source voltage of a field-effect transistor (e.g., a MOSFET) used for implementing the switching device or a collector-emitter voltage of a bipolar transistor (e.g., an IGBT) used for implementing the switching device. Still further representations include a certain load terminal voltage, e.g., a drain terminal voltage, a source terminal voltage, a collector terminal voltage, or an emitter terminal voltage. Further, the load signal may be represented by a sense voltage over a shunt resistor coupled to the switching device. In some implementations, also multiple representations of the load signal may be used in combination, e.g., a drain-source voltage and the load current, e.g., as measured by a sense voltage over a shunt resistor.

In the illustrated embodiments, the gate signal is generated by summation of multiple signal profiles. At least one of these signal profiles is adapted. This adaptation is accomplished depending on an n-th order derivative of the load signal of the switching device, with n being an integer which is equal to or larger than 2. The n-th order derivative is detected while the gate signal is applied to the switching device, i.e., during a switching operation, and then used for adaptation of the at least one signal profile. After adaptation, the at least one signal profile may be used for generation of the gate signal of a next switching operation.

In some implementations, multiple derivatives of the load signal may be detected and be used as a basis for adapting a plurality of the signal profiles. In particular, an m-th order derivative of the load signal may be detected, with m being a positive integer different from n, and one or more further signal profiles may be adapted depending on the detected m-th order derivative. For example, m may be equal to 1 and n may be equal to 2, i.e., the first and second order derivative of the load signal may be considered and be utilized for adaptation of one or more corresponding signal profiles.

The adaptation may involve a comparison of the detected n-th order and/or m-th order derivative to one or more limit values. The adaptation may then be performed depending on this comparison. For example, the adaptation may be performed depending on a deviation of the detected n-th order and/or m-th order derivative from the limit value, e.g., using an iterative learning algorithm. In some scenarios, e.g., when performing the adaptation depending on a second order or even higher order derivative, such limit values may include a positive limit value and a negative limit value.

Separate signal profiles may be provided for the switching operation from the off state to the on state and for the reverse switching operation from the on state to the off state, and such separate signal profiles may be subject to individual adaptation.

The above embodiments will now be further explained with reference to the drawings.

FIG. 1 shows exemplary signal courses of a drain-source voltage $v_{ds}$ of a power MOSFET during a switching on operation as a function of time t, and the corresponding first and second order derivatives of $v_{ds}$, i.e., $dv_{ds}/dt$ and $d^2v^{ds}/dt^2$.

As can be seen, the drain-source voltage $v_{ds}$ undergoes an S-shaped transition from a high value in the off state to a low value of substantially zero in the on state. At the same time, starting from zero, the first order derivative $dv_{ds}/dt$ first shows a substantially linear decrease which is followed by a substantially linear increase back to zero. In the second order derivative $d^2v_{ds}/dt^2$, a portion having a substantially constant negative value corresponds to the portion of the substantially linear decrease of the first order derivative $dv_{ds}/dt$, and a portion having a substantially constant positive corresponds to the portion of the substantially linear increase $dv_{ds}/dt$. However, the signal courses as shown in FIG. 1 are idealized, and in practical implementations the actual signal courses may deviate from such idealized courses, which is a potential source of EMI. For example, such deviations may be due to load variations, temperature variations, imperfections of device fabrication, or the like.

To address the problem of potential EMI, one or more of the signal profiles used for generating the gate signal may be adapted as mentioned above, e.g., with the aim of maintaining the first order derivative $dv_{ds}/dt$ and the second order derivative $d^2v_{ds}/dt^2$ within certain limits or even at desired target values. As a general rule, a more restrictive limitation may have the effect of better suppression of EMI. On the other hand, a less restrictive limitation may allow for a faster switching time and reduction of switching losses. Accordingly, it may be desirable to control the first order derivative and the second order derivative with the aim of minimizing the deviation from such limit value. This can be achieved by applying an Iterative Learning Control (ILC) algorithm as further explained below.

Figure 2:
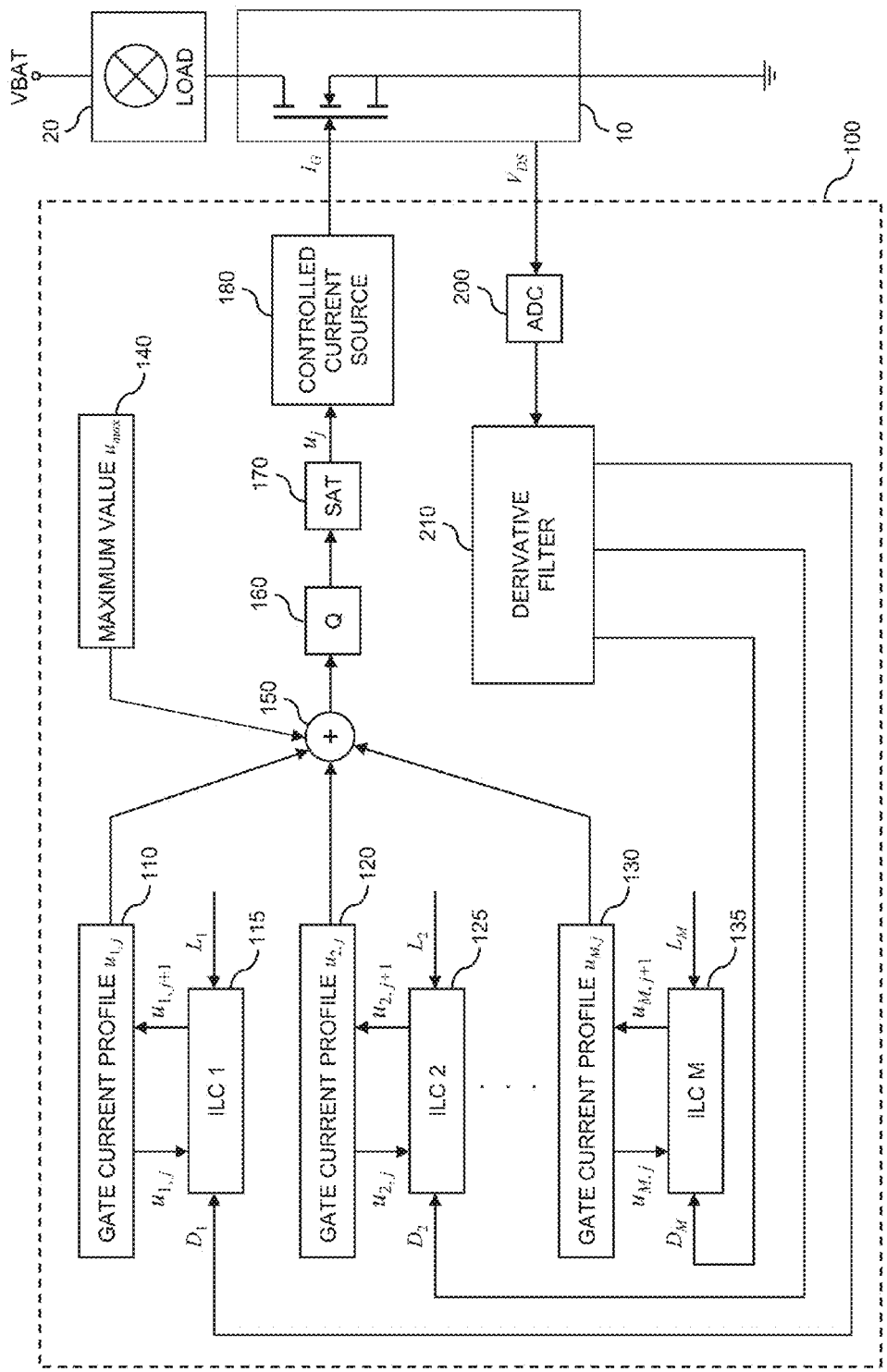
FIG. 2 shows a block diagram for schematically illustrating functionalities of a device according to an embodiment of the invention.

FIG. 2 shows a block diagram for schematically illustrating functionalities of a device 100 according to an embodiment.

As illustrated, the device 100 is employed for providing a gate signal $I_G$ to a switching device 10. The switching device 10 may for example be based on a power MOSFET or a power IGBT. The switching device 10 is illustrated as driving an exemplary load 20. In particular, the switching device 10 may be utilized for turning a current through the load 20 on, by switching the switching device into the on state, and for turning the current through the load 20 off, by switching the switching device 10 into the off state.

The gate signal $I_G$ is generated by summation of a number M of signal profiles $u_{i,j}[k]$, each formed of a time sequence of signal value samples, with i=1, 2, . . . , M, j denoting an iteration index of an iterative adaptation process, and k denoting a sample index in the time sequence. For providing the signal profiles, the device 100 includes respective gate current profile blocks 110, 120, 130, which may for example be implemented by configurable memory registers storing the signal value samples.

For generating the gate signal $I_G$ in a given iteration j, the individual signal profiles $u_{i,j}[k]$ are summed by a summation node 150. Further, in the illustrated implementation the summation node 150 also adds a desired maximum signal value $u_{max}$ to the signal profiles $u_{i,j}[k]$. The maximum value $u_{max}$ is provided by block 140, which may for example be implemented by a further configurable memory register storing a corresponding signal value.

As further illustrated, the summed signal profile output by the summation node 150 may by further subjected to filtering. In the illustrated example, the summed signal profile is filtered by a Q-filter 160 and by a saturation filter 170. The Q-filter 160 is configured to provide damping and/or averaging over multiple iterations. For example, the Q-filter 160 may be implemented on the basis of a non-causal filter, such as a moving average filter with Gaussian kernel. The saturation filter 170 is configured to provide an output which either corresponds to a minimum limit, if the input of the saturation filter 170 is smaller than the minimum limit, to a maximum limit, if the input of the saturation filter 170 is larger than the maximum limit, or to the input of the saturation filter 170, if the input of the saturation filter is in the range from the minimum value to the maximum value. The Q-filter 160 and the saturation filter 170 may be implemented as digital filters, e.g., by corresponding configuration of a digital signal processor (DSP).

The filtered summed signal profile $u_j$ of the j-th iteration is then provided to a controlled current source 180, which generates the gate signal $I_G$ as a current which is controlled by the value of the filtered summed signal profile $u_j$. The controlled current source 180 may for example be implemented by one or more current driving digital-to-analog converters (DACs), optionally supplemented by charge pump circuitry.

As further illustrated, the device 100 includes a feedback branch with an analog-to-digital converter (ADC) 200 and a derivative filter 210. The ADC 200 receives the load signal of the switching device 10, in the illustrated implementation a drain-source voltage $V_{DS}$. The derivative filter 210 has the purpose of detecting one or more derivatives $D_1, D_2, \ldots, D_M$ of the load signal $V_{DS}$. These derivatives include at least one higher order derivative, e.g., a second order derivative. Further, these derivatives may also include a first order derivative. The derivative filter 210 may for example be implemented by a DSP.

The one or more derivatives $D_1, D_2, \ldots, D_M$ of the load signal $V_{DS}$ as detected by the derivative filter 210 are utilized for adaptation of one or more of the signal profiles $u_{i,j}[k]$. For this purpose, the device 100 provides corresponding adaptation blocks 115, 125, 135. The adaptation blocks 115, 125, 135 may for example be implemented by one or more correspondingly configured or programmed processors or microcontrollers.

In the illustrated implementation, the adaptation block 115 has the purpose of adapting the signal profile $u_{1,j}[k]$ depending on the derivative $D_1$, the adaptation block 125 has the purpose of adapting the signal profile $u_{2,j}[k]$, depending on the derivative $D_2$, and the adaptation block 135 has the purpose of adapting the signal profile $u_{1,j}[k]$, depending on the derivative $D_M$. As a general rule, at least one signal profile may be adapted depending on the derivative of a given order. For example, three signal profiles could be provided (i.e., M=3), the signal profile $u_{1,j}[k]$ could be adapted depending on the derivative $D_1$, which corresponds to the first order derivative of the load signal $V_{DS}$, and the signal profiles $u_{2,j}[k]$ and $u_{3,j}[k]$ could be adapted depending on the derivatives $D_2$ and $D_3$, respectively, which both correspond to the second order derivative of the load signal $V_{DS}$. The adaptation of two separate signal profiles $u_{2,j}[k]$ and $u_{3,j}[k]$ depending on the second order derivative may allow for more efficiently taking into account that the signal course of the second order derivative may require control and limitation in both the positive domain and the negative domain, e.g., as illustrated in the example of FIG. 1.

The adaptation of the individual signal profiles $u_{i,j}[k]$ may be accomplished depending on a comparison of the detected derivative $D_1, D_2, \ldots, D_M$ to a corresponding limit value $L_1, L_2, \ldots, L_M$. In this way, the values of the derivatives $D_1, D_2, \ldots, D_M$ which occur during the switching operation of the switching device 10 may be limited to a range which is for example tolerable in view of EMI or EMC.

In the illustrated implementation, the adaptation blocks 115, 125, 135 are assumed to be based on an ILC algorithm, which performs the adaptation iteratively with each switching operation. For example, on the basis of the derivatives $D_1, D_2, \ldots, D_M$ as detected while applying the gate signal $I_G$ of the j-th iteration to switch the switching device 10 from the off state to the on state, the signal profiles of the (j+1)-th iteration may be adapted, and these adapted signal profiles may then be utilized for generating the gate signal $I_G$ applied in the next switching operation of the switching device from the off state to the on state. Similarly, on the basis of the derivatives $D_1, D_2, \ldots, D_M$ as detected while applying the gate signal $I_G$ of the j-th iteration to switch the switching device 10 from the on state to the off state, further signal profiles of the (j+1)-th iteration may be adapted, and these adapted further signal profiles may then be utilized for generating the gate signal $I_G$ applied in the next switching operation of the switching device from the on state to the off state. Accordingly, separate signal profiles may be adapted for each switching direction. Adaptations in real time, e.g., by adapting a signal profile used for generating the gate signal $I_G$ while the gate signal $I_G$ is still being applied to the switching device, are not needed.

An exemplary implementation of the ILC algorithm may operate according to the following ILC law:

$$\bar{u}_{i,j}[k] = Q_i(u_{i,j}[k] + \Gamma_i[k]e_{i,j}[k]),$$

$$u_{i,j+1}[k] = \mathrm{sat}(\bar{u}_{i,j+1}[k], 0, -u_{max}),$$

where $\Gamma_i[k]$ denotes a learning gain for the i-th signal profile, $e_{i,j}[k]$ a difference between the limit value $L_i$ and the detected derivative $D_i$. Further, $Q_i$ denotes a Q-filter for the i-th signal profile, e.g., a non-causal filter such as a moving average filter with Gaussian kernel, and $\mathrm{sat}(\_)$ denotes a saturation function according to:

$$\mathrm{sat}(\bar{u}_{i,j+1}[k], 0, -u_{max}) = \begin{cases} 0, & \text{if } \bar{u}_{i,j+1}[k] > 0 \\ \bar{u}_{i,j+1}[k], & \text{if } -u_{max} \leq \bar{u}_{i,j+1}[k] \leq 0 \\ -u_{max}, & \text{if } \bar{u}_{i,j+1}[k] < -u_{max} \end{cases}.$$

In this case, 0 defines the maximum limit of the saturation function, and $-u_{max}$ defines the minimum limit of the saturation function.

The learning gain $\Gamma_i[k]$ can either be constant or time varying. A time varying learning gain could for example be implemented on the basis of the Newton-method to achieve faster adaptation speed.

The summation by the summation node 150 and filtering by the Q-filter 160 and saturation filter 170 may then be represented as follows:

$$\bar{u}_{j+1}[k] = Q(u_{max} + u_{1,j+1}[k] + \ldots + u_{M,j+1}[k]),$$

$$u_{j+1}[k] = \mathrm{sat}(\bar{u}_{j+1}[k], u_{max}, 0),$$

with the saturation function implemented by the saturation filter 170 being defined according to:

$$\mathrm{sat}(\bar{u}_{j+1}[k], u_{max}, 0) = \begin{cases} u_{max}, & \text{if } \bar{u}_{j+1}[k] > u_{max} \\ \bar{u}_{j+1}[k], & \text{if } 0 \leq \bar{u}_{j+1}[k] \leq u_{max} \\ 0, & \text{if } \bar{u}_{j+1}[k] < 0 \end{cases}.$$

An extreme scenario may thus correspond to applying $u_{max}$ for the whole switching operation, which may allow for maximizing the switching speed. However, in typical scenarios, a further limitation by the adapted signal profiles will occur for at least some of the signal value samples, which allows for keeping the derivatives in the desired range.

Figure 3:
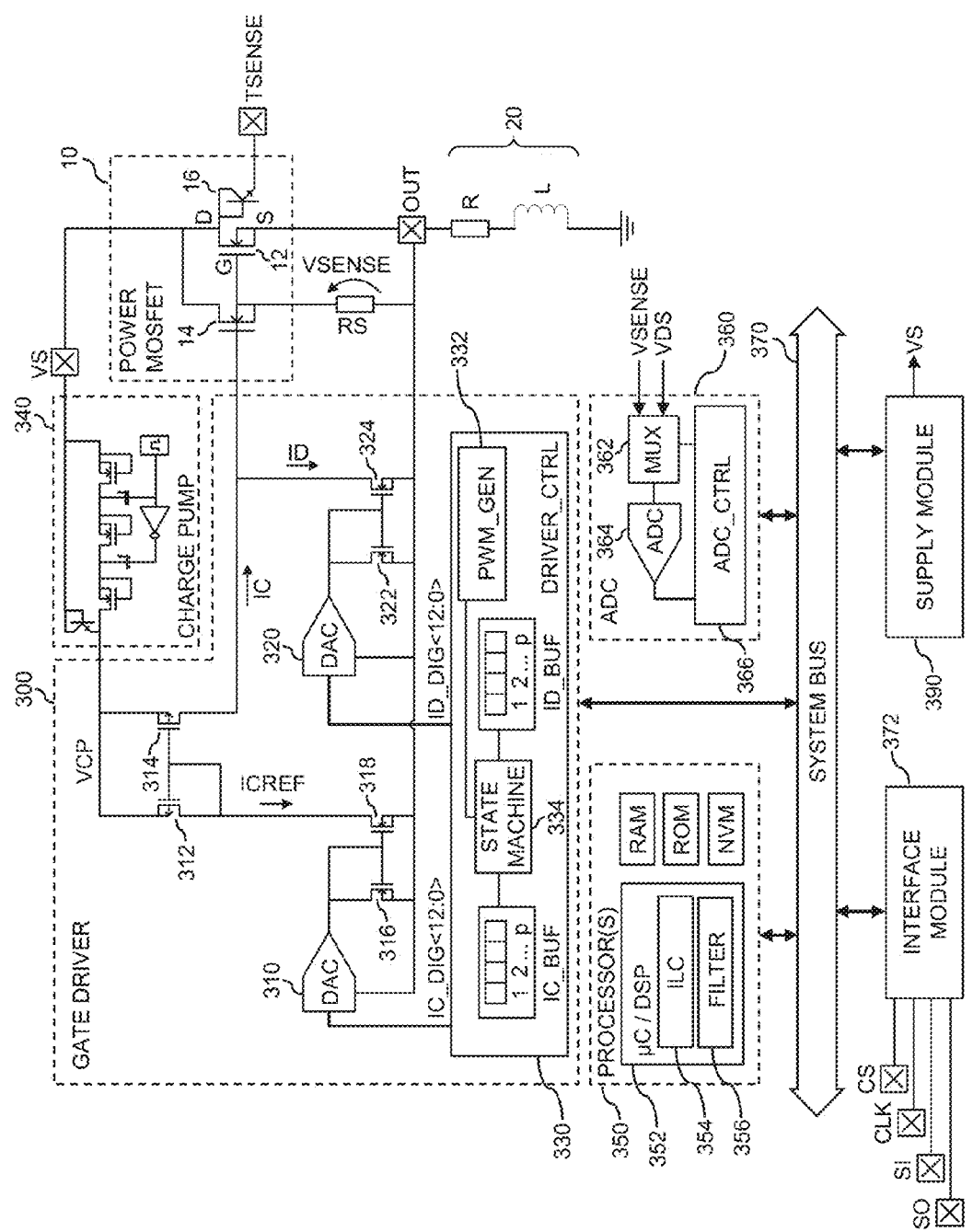
FIG. 3 schematically illustrates an exemplary circuit implementation according to an embodiment of the invention.

FIG. 3 schematically illustrates an exemplary circuit implementation of the above-described concepts. In the illustrated example, the switching device 10 is implemented as a power MOSFET and includes a Double-Diffused Metal Oxide Semiconductor (DMOS) transistor 12. Further, the switching device 10 includes integrated sense structures, in particular a sense transistor 14. The sense structures may also include a temperature sensing diode 16. The sense transistor 14 mirrors the current through the DMOS transistor 12, and the mirrored current is fed through a shunt resistor RS. A voltage VSENSE which represents the load current of the switching device 10 can thus be measured over the shunt resistor RS. In addition or as an alternative, also the drain-source voltage VDS of the DMOS transistor 12 can be measured. The load 20 is schematically represented by a resistor R and an inductor L. Accordingly, multiple representations of the load signal of the switching device 10 are available.

In the example of FIG. 3 the circuitry for generating a gate signal for the switching device 10 includes a floating gate driver circuit 300, a charge pump circuit 340, a processor module 350 with one or more processors, and an ADC circuit 360. Further, an interface module 372 and a supply module 390 are provided. The interface module 372 may for example be used for transmitting external control information, such as a command SO for switching the switching device to the on state, a command SI for switching the switching device to the off state, an external clock signal CLK, or configuration and/or service information CS. The supply module 390 may be responsible for generating required supply voltages, supply currents or internal clock signals, managing the different system modes, such as energy saving modes, and transitions therebetween.

The gate driver circuit 300 provides a first DAC 310 for controlling a charge current IC which is applied to a gate terminal G of the DMOS transistor 12 in the switching device 10 when performing a switching operation from the off state to the on state. Further, the gate driver circuit 300 provides second DAC 320 for controlling a discharge current ID which is applied to the gate terminal G of the DMOS transistor 12 in the switching device 10 when performing a switching operation from the off state to the on state. Further, the gate driver circuit 300 provides current mirrors implemented by p-type Metal Oxide Semiconductor (PMOS) transistors 312, 314 and n-type Metal Oxide Semiconductor (NMOS) transistors 316, 318, 322, 324. The current mirrors are supplied by the charge pump circuit 340 and are used to generate the charge current IC and the discharge current ID. More specifically, the first DAC 310 controls a current through the NMOS transistor 316 which is mirrored to a reference charge current ICREF through the NMOS transistor 318 and the PMOS transistor 312. This current is turn mirrored to the charge current IC through the PMOS transistor 314. The second DAC 320 is used to control a current through the NMOS transistor 322 which is mirrored to the discharge current ID through the NMOS transistor 324.

As further illustrated, the gate driver circuit 300 is provided with a driver controller (DRIVER_CTRL) 330. The driver controller 330 generates a first digital input signal IC_DIG<12:0> which is supplied to the first DAC 310, and a second digital input signal ID_DIG<12:0> which is supplied to the second DAC 320. The digital input signals IC_DIG<12:0> and ID_DIG<12:0> are provided by a first buffer register IC_BUF and a second buffer register ID_BUF, respectively. The buffer register IC_BUF stores the currently applicable overall signal profile for the switching operation from the off state to the on state. The buffer register ID_BUF stores the currently applicable overall signal profile for the reverse switching operation from the off state to the on state. Such overall signal profile may for example correspond to the signal $u_j$ of FIG. 2. The overall signal profiles may for example each be stored as a time sequence of multibit values, using a sample rate of 2 MHz. In the exemplary implementation of FIG. 3, it is assumed that the DACs 310, 320 and the digital input signals IC_DIG<12:0> and ID_DIG<12:0> have 13 bit resolution. For example, when assuming a total control range of the charge current IC and discharge current is 1 mA, this resolution allows a control granularity of 0.12 µA. The generation of the digital input signals ID_DIG<12:0> and ID_DIG<12:0> is controlled by a state machine 334 and a generator (PWM_GEN) 332 of a pulse-width modulation (PWM) signal to trigger the switching operations.

The overall signal profiles stored in the buffer registers IC_BUF, ID_BUF may be configured by the processor module 350 via the system bus 370. The processor module 350 may determine these overall signal profiles using the above-described derivative based adaptation. The processor module 350 may also access control registers and/or diagnostic registers of the gate driver controller 330, e.g., for purposes of controlling and monitoring the state machine 334.

For utilization in the adaptation process, the ADC circuit 360 supplies, via the system bus 370, the CPU 350 with a digitized representation of the load signal of the switching device 10. For example, such digitized representation may have a resolution of 13 bit and be based on a sampling rate of 10 MHz. In the illustrated example, the ADC circuit 360 provides a digitized representation of the drain-source voltage VDS and/or a digitized representation of the sense voltage VSENSE, which is a measure of the load current. A multiplexer (MUX) 362 of the ADC circuit 360 may be used for alternatively supplying the drain-source voltage VDS or the sense voltage VSENSE to a ADC 364 of the ADC circuit 360. An ADC controller (ADC_CTRL) 366 may be provided for controlling operation of the multiplexer 366 and/or of the ADC 364. The ADC controller 366 may also handle the communication over system bus 370. For example, the ADC controller 366 may store the digitized representation(s) in special purpose registers which are accessible to the processor module 350 via the system bus 370.

On the basis of the supplied digitized representation of the load signal, the processor module 350 performs the detection of the required derivative(s), e.g., second order derivative and optionally also first order derivative, of the load signal and performs the above-described adaptation of signal profiles depending on the detected derivative(s). For this purpose, the processor module 350 implements a microcontroller (µC) and DSP module 352, which in turn includes an ILC module 354 and a filter module 356. The ILC module 354 is responsible for the iterative adaptation of one or more signal profiles, and the filter module 356 is responsible for detecting the derivatives which are utilized as input values for the adaptation. The µC/DSP module 352, the ILC module 354 and the filter module 356 may be implemented by program code which is executed by the processor module 350. For example, such program code may be stored in a random access memory (RAM), a read-only memory (ROM), and/or a non-volatile memory (NVM) of the processor module 350. The NVM may also be used for initial parameter trimming, initial configuration, and/or calibration purposes. Furthermore, the NVM may be used to store adapted signal profiles before the system is powered down or switched to an energy saving mode.

As a matter of course, the processor module 350 may also be utilized for implementing further functionalities, e.g., noise filtering, management of the system bus 370, handling external communication via the interface module 372, or the like.

Figure 4:
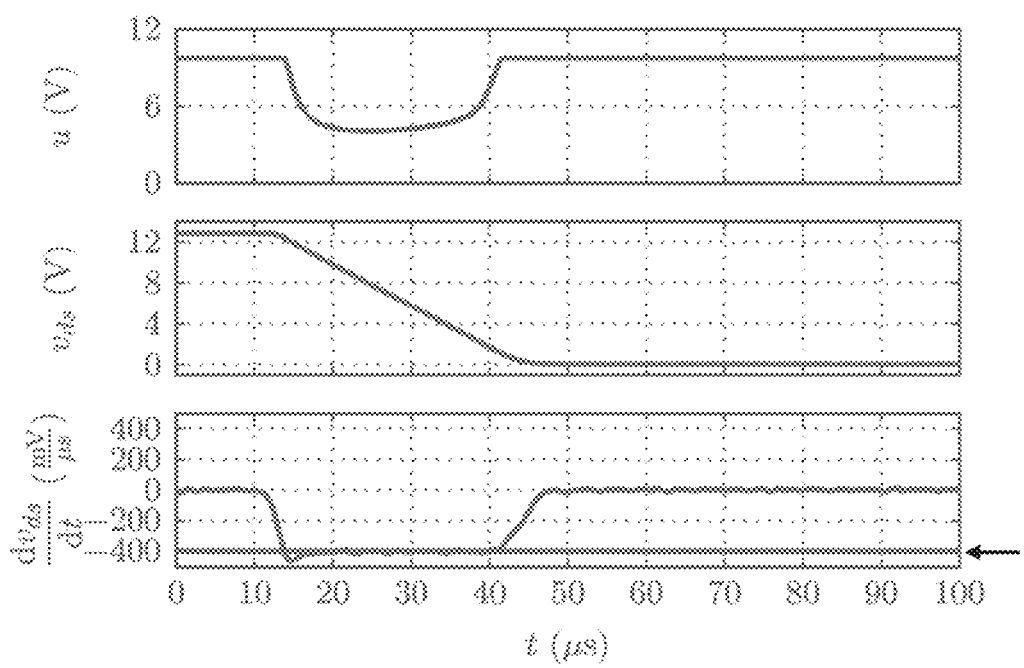
FIG. 4 shows exemplary experimental results for a scenario when performing adaptation of a signal profile depending on a first order derivative of a drain-source voltage of a power device during a switch-on operation.
Figure 5:
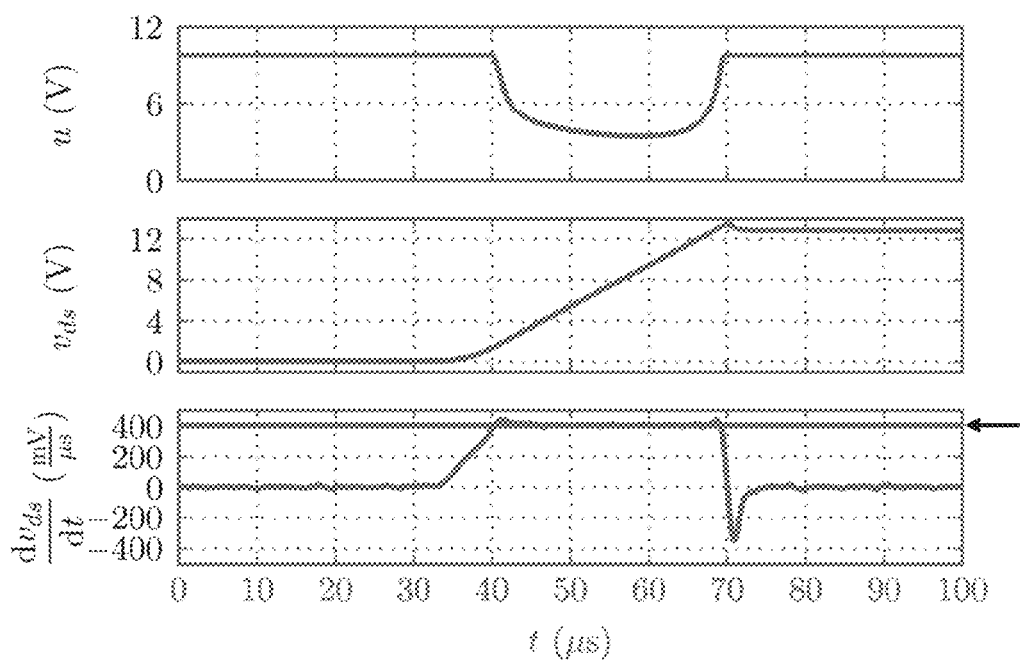
FIG. 5 shows exemplary experimental results for a scenario when performing adaptation of a signal profile depending on a first order derivative of a drain-source voltage of a power device during a switch-off operation.

FIG. 4 shows exemplary measurement results for a switching operation from the off state to the on state, while using circuitry as illustrated in FIG. 3 to perform the above-mentioned signal profile adaptation depending on the first order derivative of the drain-source voltage $v_{ds}$. For the signal profile adaptation, a limit value of −400 mV/µs was defined for the first order derivative of $v_{ds}$, as indicated by a horizontal arrow. For the measurements, the drain-source voltage $v_{ds}$ was sampled with a sampling time of 0.1 µs, corresponding to a sampling rate of 10 MHz, to obtain a sampled signal sequence of 1000 samples. The same sample length was selected for the signal profiles. A power MOSFET designated as "BSC02N03", provided by Infineon Technologies AG, was switched between the on state and the off state while driving an ohmic and inductive load with R=3.2Ω and L=14 pH with a battery voltage of 13.5V. FIG. 5 shows corresponding measurement results for the reverse switching operation from the on state to the off state, in this case using a limit value of +400 mV/µs for the first order derivative of $v_{ds}$. As can be seen, the first order derivative of $v_{ds}$ is not only limited, but actually controlled to closely match the defined limit values during the switching operation. This may help to increase switching speed and reduce switching losses.

Figure 6:
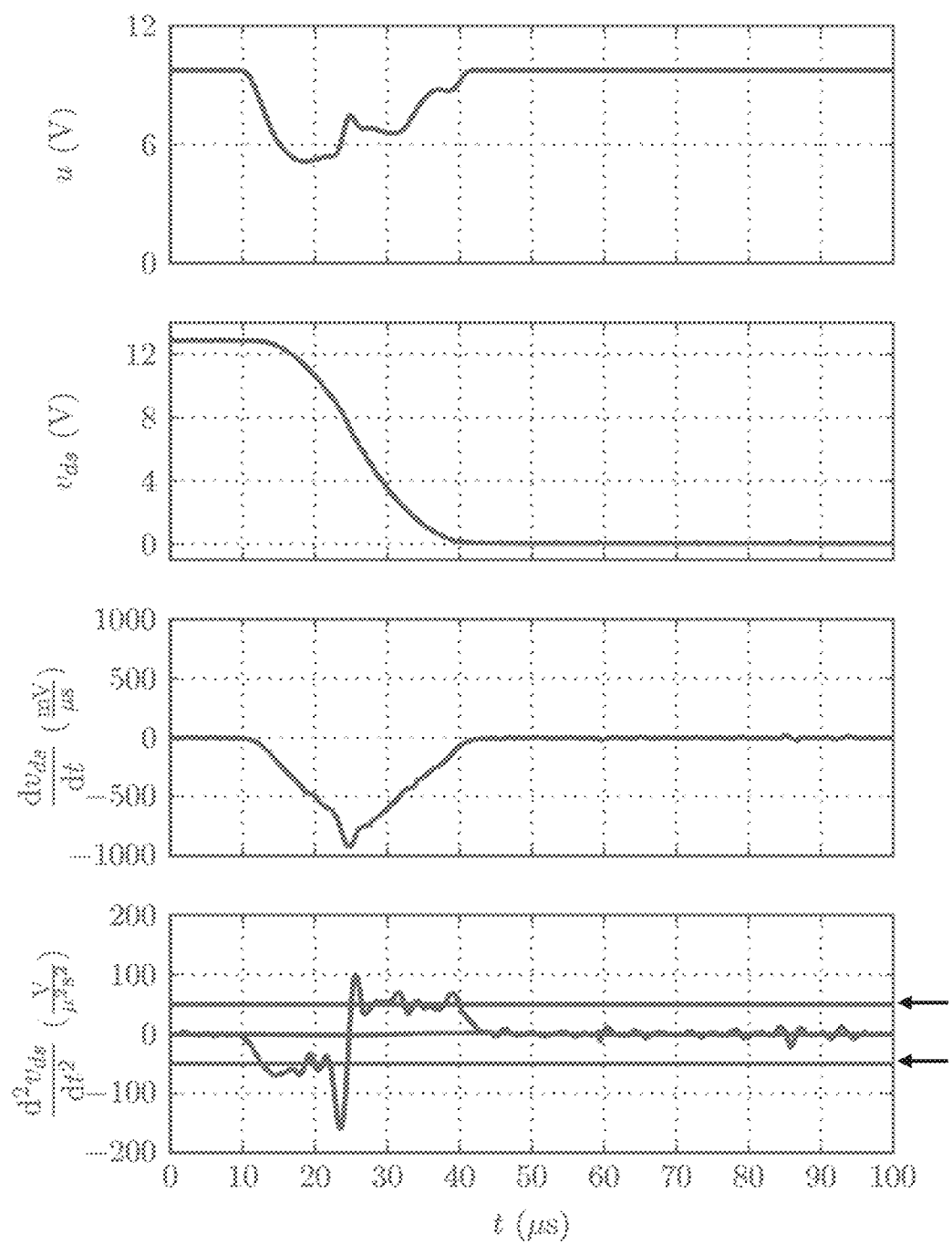
FIG. 6 shows exemplary experimental results for a scenario when performing adaptation of two signal profiles depending on a second order derivative of a drain-source voltage of a power device during a switch-on operation.
Figure 7:
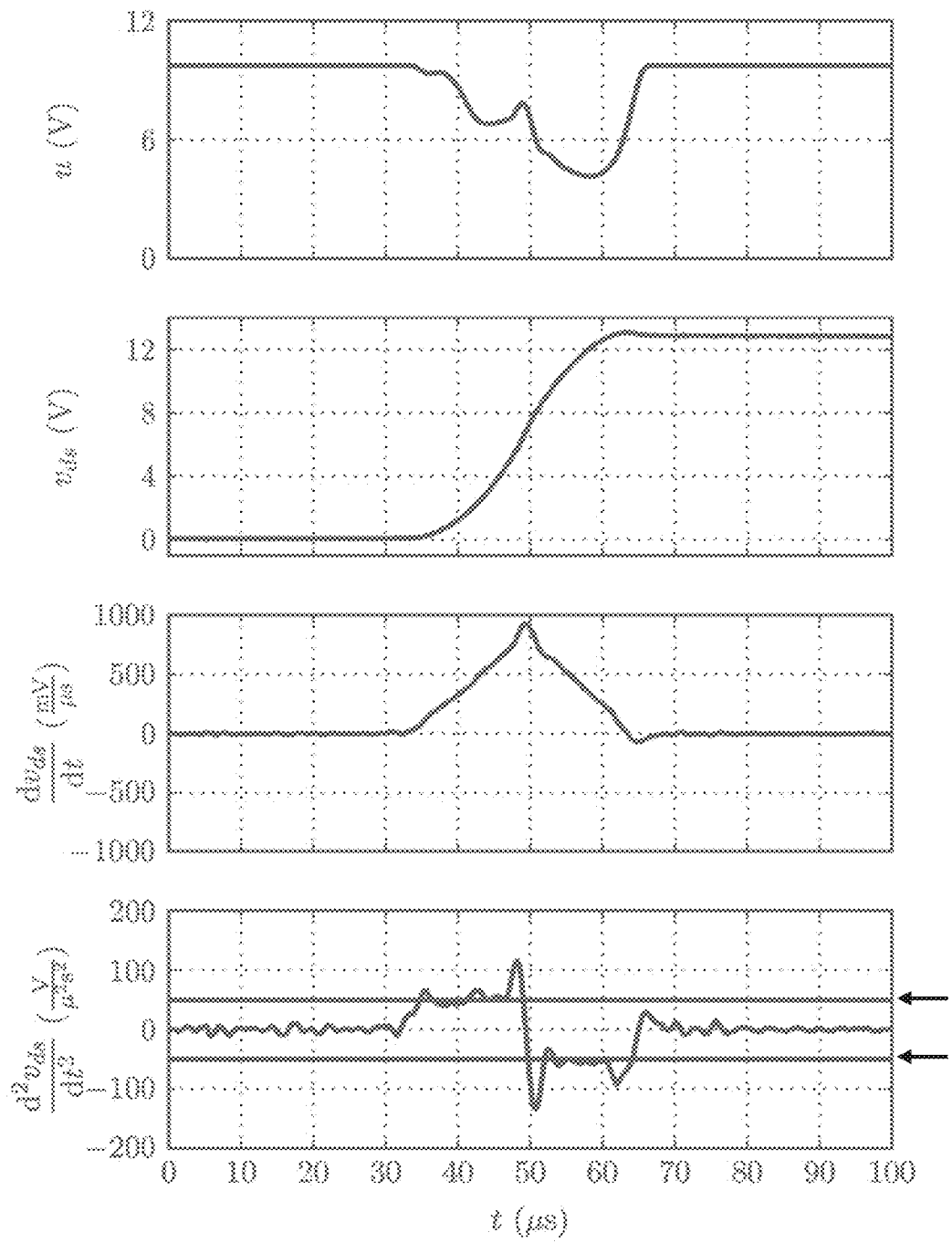
FIG. 7 shows exemplary experimental results for a scenario when performing adaptation of two signal profiles depending on a second order derivative of a drain-source voltage of a power device during a switch-off operation.

FIG. 6 shows exemplary measurement results for a switching operation from the off state to the on state, while using circuitry as illustrated in FIG. 3 to perform the above-mentioned signal profile adaptation depending on the second order derivative of the drain-source voltage $v_{ds}$. FIG. 7 shows corresponding measurement results for the reverse switching operation from the on state to the off state. For the signal profile adaptation, a positive limit value of +50V/(µs)² and a negative limit value of −50V/(µs)² were defined for the second order derivative of $v_{ds}$, as indicated by a horizontal arrows. The positive limit value and the negative limit value were applied for adaptation of separate signal profiles, i.e., a first signal profile was adapted depending on the positive limit value and a second signal profile was adapted depending on the negative limit value. Other parameters underlying the measurements were the same as in the examples of FIGS. 4 and 5. As can be seen, the second order derivative of $v_{ds}$ is not only limited, but actually controlled to match the defined limit values during the different portions of the switching operation. This may help to increase switching speed and reduce switching losses. Further, EMC performance can be improved as compared to the scenario of FIGS. 4 and 5.

Figure 8:
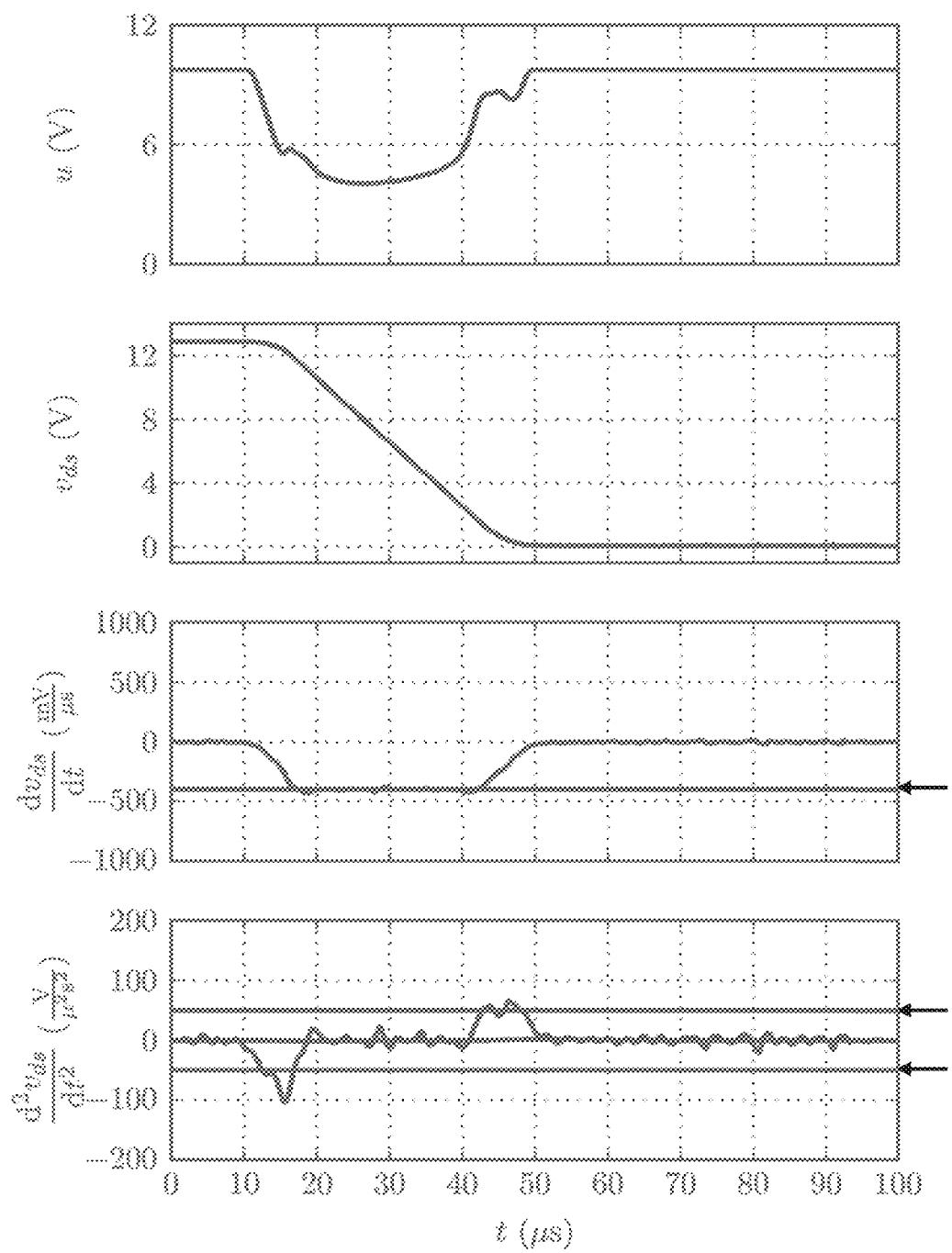
FIG. 8 shows exemplary experimental results for a scenario when performing adaptation of three signal profiles depending on a first order derivative and a second order derivative of a drain-source voltage of a power device during a switch-on operation.
Figure 9:
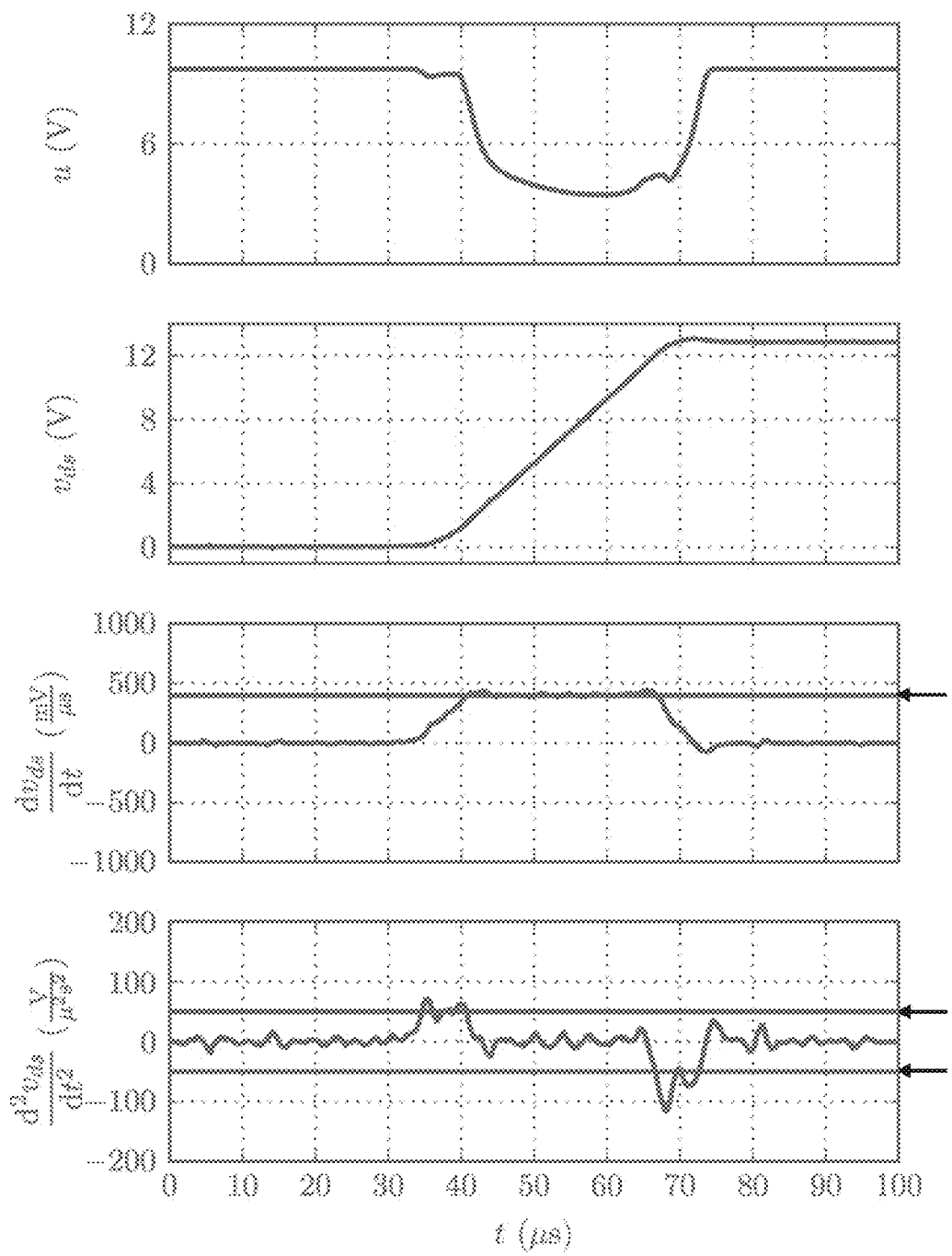
FIG. 9 shows exemplary experimental results for a scenario when performing adaptation of two signal profiles depending on a first order derivative and a second order derivative of a drain-source voltage of a power device during a switch-off operation.

FIG. 8 shows exemplary measurement results for a switching operation from the off state to the on state, while using circuitry as illustrated in FIG. 3 to perform the above-mentioned signal profile adaptation depending on first order derivative and the second order derivative of the drain-source voltage $v_{ds}$. For the signal profile adaptation depending on the first order derivative of $v_{ds}$, a limit value of −400 mV/µs was defined. For the signal profile adaptation depending on the second order derivative of $v_{ds}$, a positive limit value of +50V/(µs)² and a negative limit value of −50 V/(µs)² were defined. The limit values are indicated by horizontal arrows. The different limit values were applied for adaptation of separate signal profiles, i.e., a first signal profile was adapted depending on the limit value for the first order derivative, a second signal profile was adapted depending on the positive limit value for the second order derivative, and a third signal profile was adapted depending on the negative limit value for the second order derivative. Other parameters underlying the measurements were the same as in the examples of FIGS. 4 and 5. FIG. 9 shows corresponding measurement results for the reverse switching operation from the on state to the off state, in this case using a limit value of +400 mV/µs for the first order derivative of $v_{ds}$. As can be seen, the first and second order derivatives of $v_{ds}$ are not only limited, but actually controlled to match the defined limit values during the different portions of the switching operation. This may help to increase switching speed and reduce switching losses. Further, EMC performance can be significantly improved as compared to the scenario of FIGS. 4 and 5, and also as compared to the scenario of FIGS. 6 and 7.

Figure 10:
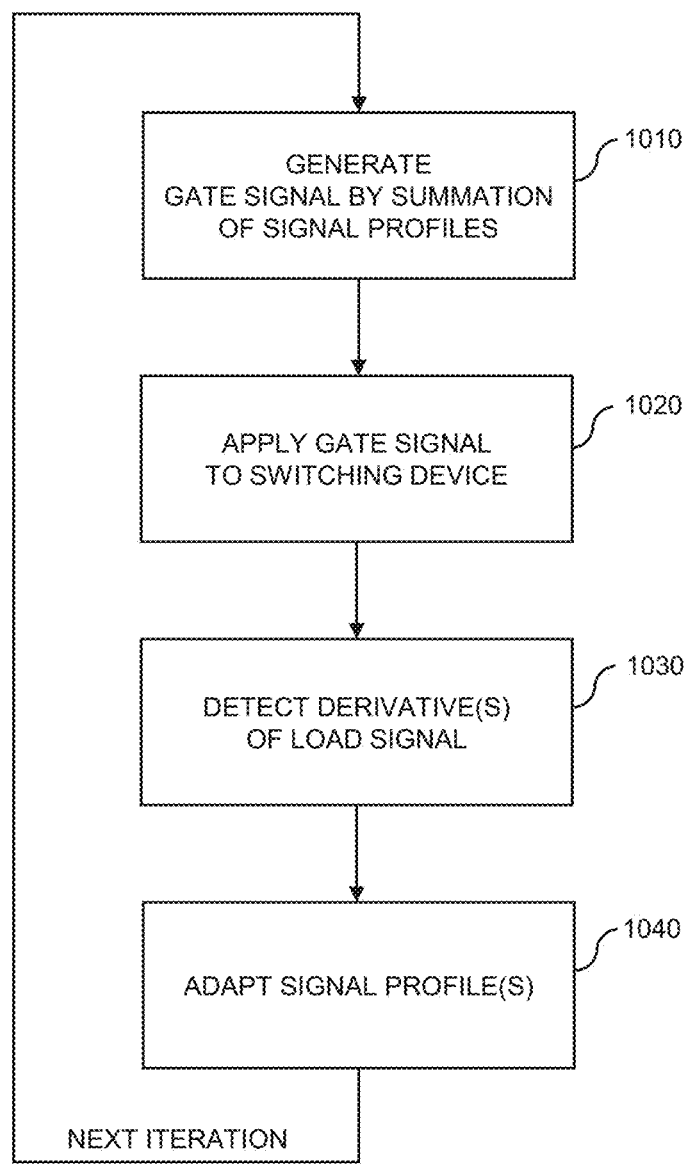
FIG. 10 shows a flowchart for schematically illustrating a method according to an embodiment of the invention.

FIG. 10 shows a flowchart for illustrating a method which may be used for implementing the above-described concepts. For example, steps of the method could be performed by one or more elements or components of the device 100 as illustrated in FIG. 2 or by one or more elements or components of circuitry as illustrated in FIG. 3.

At step 1010, a gate signal is generated by summation of multiple signal profiles. This may be accomplished by a gate signal generator. Such gate signal generator may for example be implemented by the signal profile blocks 110, 120, 130, the summation node 150, the filters 160, 170, and the current source 180 as illustrated in FIG. 2. Further, such gate signal generator could be implemented by the gate driver circuit 300, and the processor module 350 of FIG. 3. In some implementations, the signal profiles may include a first signal profile associated with a switching operation to the on state and a second signal profile associated with a switching operation to the off state, i.e., different switching direction may be associated with separate signal profiles.

At step 1020, the gate signal is applied to switch a switching device between an off state and an on state. The switching device may for example be based on a MOSFET, such as in the exemplary implementation of FIG. 3, or on an IGBT.

At step 1030, at least an n-th order derivative of a load signal of the switching device is detected, with n being an integer which is equal to or larger than 2. This is accomplished while the gate signal is applied to the switching device. The detection of the n-th order derivative may be performed by a detector. Such detector may for example be implemented by the ADC 200 and the derivative filter 210 of FIG. 2. Further, such detector may be implemented by the ADC circuit 360 and the processor module 350 of FIG. 3.

In some implementations, also an m-th order derivative of the load signal may be detected at step 1030, with m being a positive integer different from n. For example, m can be 1 and n can be 2. The detection of the m-th order derivative may be performed by the same detector as used for detecting the n-th order derivative.

At step 1040, one or more of the signal profiles, used for the summation in step 1010, are adapted. This is accomplished depending on n-th order derivative as detected at step 1030. This adaptation may for example be performed by an adaptation circuit. Such adaptation circuit may for example be implemented by the ILC blocks 115, 125, 135 of FIG. 2, or by the processor module 350 of FIG. 3, in particular by the ILC module 354. The adaptation may involve comparing the detected n-th order derivative to one or more limit values and adapting the signal profile(s) depending on the comparison. The limit values may include both a positive limit value and a negative limit value, e.g., as mentioned above in the examples considering a positive limit value and a negative limit value for the second order derivative. When using such limit value(s), the signal profile(s) may be adapted depending on a deviation of the detected n-th order derivative from the limit value, e.g., using the above-mentioned learning gain $\Gamma_i[k]$.

In implementations where also the m-th order derivative is detected at step 1030, step 1040 may also include adapting one or more further signal profiles of the multiple signal profiles depending on the detected m-th order derivative. This adaptation may be performed by the same adaptation circuit as used for the adaptation depending on the n-th order derivative. However, such adaptation circuitry may provide separate functional blocks for the adaptation depending on the n-th order derivative and for the adaptation depending on the m-th order derivative, as for example illustrated in FIG. 2. The adaptation depending on the m-th order derivative may involve comparing the detected m-th order derivative to one or more limit values and adapting the further signal profile(s) depending on the comparison. The adaptation may then in particular depend on a deviation of the detected m-th order derivative from the limit value.

If separate signal profiles are provided for the switching operation to the on state and for the reverse switching operation to the off state, these signal profiles may be subject to individual adaptation depending on the n-th order derivative or m-th order derivative as detected during the corresponding switching operation.

The adaptation of the signal profile(s) and optionally of the further signal profile(s) may be performed in an iterative manner. For example, as illustrated in FIG. 10, the method may repeat steps 1010, 1020, 1030, and 1040 with each iteration.

As can be seen, the concepts as explained above may be used for efficiently generating a gate signal for a switching device. The iterative adaptation of the signal profile(s) may help to achieve optimized operation characteristics, e.g., with respect to suppression of EMI, EMC, switching speed, or switching losses. Further, robustness with respect to temperature variations, model inaccuracies, load variations, or measurement noise may be achieved. The iterative adaptation algorithm may also ensure rapid adaptation to variable conditions. Typically, a significant improvement can already be achieved from one iteration to the next iteration, i.e., by the next switching cycle. Further, the illustrated concepts may be applied with respect to various kinds of switching devices, power classes, or loads. Furthermore, the concepts may be applied in a separate gate driver for an external power device or be applied in integrated solutions, in which the gate driver and adaptation circuitry is integrated with the power device, e.g., on the same chip or in the same package. Configurability of the limit value(s) applied in the adaptation process may allow for usage in various application fields, e.g., subject to different requirements with respect to EMI or EMC. Further, the characteristics of the different switching directions can be made individually controllable by using separate signal profiles for the switching from the off state to the on state and for switching from the on state to the off state.

It is to be understood that the above-described concepts and embodiments are susceptible to various modifications. For example, the adaptation could be based on other learning algorithms. Further, any combination of higher order derivatives, e.g., with order of three or even higher, could be considered in the adaptation process. Further, as mentioned above, in some implementations different representations of the load signal could be used in combination, e.g., a drain-source voltage and a load current. In such cases, the different representations may also be utilized for adapting separate signal profiles.

What is claimed is:

1. A device, comprising:
a gate signal generator configured to generate a gate signal applied to switch a switching device between an off state and an on state, the gate signal generator being configured to generate the gate signal by summation of multiple signal profiles;
a detector configured to detect, while the gate signal is applied to the switching device, at least an n-th order derivative of a load signal of the switching device, with n being an integer which is equal to or larger than 2; and
an adaptation circuit configured to adapt one or more of the signal profiles depending on the detected n-th order derivative.

2. The device according to claim 1,
wherein the adaptation circuit is configured to compare the detected n-th order derivative to one or more limit values and adapt said one or more signal profiles depending on the comparison.

3. The device according to claim 2,
wherein said one or more limit values comprise a positive limit value and a negative limit value.

4. The device according to claim 2,
wherein the adaptation depends on a deviation of the detected n-th order derivative from the limit value.

5. The device according to claim 1,
wherein said one or more signal profiles comprise a first signal profile associated with a switching operation to the on state and a second signal profile associated with a switching operation to the off state.

6. The device according to claim 1,
wherein the detector is further configured to detect an m-th order derivative of the load signal, with m being a positive integer different from n; and
wherein the adaptation circuit is further configured to adapt one or more further signal profiles of said multiple signal profiles depending on the detected m-th order derivative.

7. The device according to claim 6,
wherein the adaptation circuit is configured to compare the detected m-th order derivative to one or more limit values and adapt said one or more further signal profiles.

8. The device according to claim 7,
wherein the adaptation of said one or more further signal profiles depends on a deviation of the detected m-th order derivative from the limit value.

9. The device according to claim 6,
wherein m is equal to 1 and n is equal to 2.

10. The device according to claim 1,
wherein the adaptation circuit is configured to perform said adaptation iteratively, after each switching operation between the off state and the on state.

11. The device according to claim 1,
wherein the switching device comprises a metal oxide semiconductor field effect transistor.

12. The device according to claim 1,
wherein the switching device comprises an insulated gate bipolar transistor.

13. A switching device, comprising:
a gate signal generator configured to generate a gate signal applied to switch the switching device between an off state and an on state, the gate signal generator being configured to generate the gate signal by summation of multiple signal profiles;
a detector configured to detect, while the gate signal is applied to the switching device, at least an n-th order derivative of a load signal of the switching device, with n being an integer which is equal to or larger than 2; and
an adaptation circuit configured to adapt one or more of the signal profiles depending on the detected n-th order derivative.

14. A method, comprising:
generating a gate signal by summation of multiple signal profiles;
applying the gate signal to switch a switching device between an off state and an on state;
detecting, while the gate signal is applied to the switching device, at least an n-th order derivative of a load signal of the switching device, with n being an integer which is equal to or larger than 2; and
adapting one or more of the signal profiles depending on the detected n-th order derivative.

15. The method according to claim 14, comprising:
comparing the detected n-th order derivative to one or more limit values; and
adapting said one or more signal profiles depending on the comparison.

16. The method according to claim 15,
wherein said one or more limit values comprise a positive limit value and a negative limit value.

17. The method according to claim 16, comprising:
adapting said one or more signal profiles depending on a deviation of the detected n-th order derivative from the limit value.

18. The method according to claim 14,
wherein said one or more signal profiles comprise a first signal profile associated with a switching operation to the on state and a second signal profile associated with a switching operation to the off state.

19. The method according to claim 14, comprising:
detecting an m-th order derivative of the load signal, with m being a positive integer different from n; and
adapting one or more further signal profiles of the signal profiles depending on the detected m-th order derivative.

20. The method according to claim 19, comprising:
comparing the detected m-th order derivative to one or more limit values; and
adapting said one or more further signal profiles.

21. The method according to claim 20, comprising:
adapting said one or more further signal profiles depending on a deviation of the detected m-th order derivative from the limit value.

22. The method according to claim 19,
wherein m is equal to 1 and n is equal to 2.

23. The method according to claim 14, comprising:
performing the adaptation said one or more signal profiles iteratively, after each switching operation between the off state and the on state.

* * * * *